US012765111B2

(12) United States Patent
Shen et al.

(10) Patent No.: US 12,765,111 B2
(45) Date of Patent: Oct. 13, 2026

(54) PHOTOVOLTAIC MODULE WITH OPTIMIZED ASPECT RATIO OF METAL GRID BASED ON SURFACE MODIFICATION

(71) Applicant: CNBM RESEARCH INSTITUTE FOR ADVANCED GLASS MATERIALS GROUP CO., LTD., Bengbu (CN)

(72) Inventors: Yilei Shen, Schwetzingen (DE); Marko Stoelzel, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 19/323,504

(22) Filed: Sep. 9, 2025

(65) Prior Publication Data

US 2026/0013261 A1 Jan. 8, 2026

Related U.S. Application Data

(60) Division of application No. 18/933,503, filed on Oct. 31, 2024, now Pat. No. 12,439,727, and a continuation of application No. PCT/CN2023/134046, filed on Nov. 24, 2023.

(51) Int. Cl.
*H10F 77/20* (2025.01)
*H10F 71/00* (2025.01)

(52) U.S. Cl.
CPC ........... *H10F 77/215* (2025.01); *H10F 71/00* (2025.01)

(58) Field of Classification Search
CPC ......... H10F 71/00; H10F 71/138–1385; H10F 77/215; H10F 19/30–35; H10F 19/90–904
See application file for complete search history.

(56) References Cited

U.S. PATENT DOCUMENTS

2010/0252109 A1 10/2010 Hong et al.
2011/0214734 A1 9/2011 Lee et al.
2012/0199190 A1 8/2012 Kwag
2012/0231576 A1 9/2012 King
2015/0060112 A1 3/2015 Cok
(Continued)

FOREIGN PATENT DOCUMENTS

CN 102629640 A 8/2012
CN 116830277 A 9/2023
(Continued)

OTHER PUBLICATIONS

KR 20180055542A English machine translation (Year: 2018).*

*Primary Examiner* — Andrew J Golden

(57) ABSTRACT

A photovoltaic module with an optimized aspect ratio of a metal grid based on surface modification, including a front electrode and a plurality of protrusion groups. The plurality of protrusion groups are formed on the front electrode. Each of the plurality of protrusion groups includes at least two protrusion structures. At least two of the plurality of protrusion groups form a protrusion arrangement. A gap for limiting a width of applied liquid is formed between any adjacent two of the plurality of protrusion groups. A height difference is formed between top ends of the protrusion structures and an upper surface of the front electrode.

3 Claims, 20 Drawing Sheets

(56) References Cited

U.S. PATENT DOCUMENTS

| | | | |
|---|---|---|---|
| 2016/0126406 | A1 | 5/2016 | Uzu et al. |
| 2016/0359065 | A1 | 12/2016 | Ziltener et al. |
| 2019/0157482 | A1 | 5/2019 | Ziltener et al. |

FOREIGN PATENT DOCUMENTS

| | | | |
|---|---|---|---|
| JP | H04262338 | A | 9/1992 |
| JP | 2010010245 | A | 1/2010 |
| JP | 2014067746 | A | 4/2014 |
| KR | 20180055542 | A | 5/2018 |
| WO | 2023141884 | A1 | 8/2023 |
| WO | 2023141891 | A1 | 8/2023 |

* cited by examiner

Prior Art

Prior Art

Prior Art

Prior Art

Prior Art

Prior Art

Prior Art

| | 1 | 2 |
|---|---|---|
| Maximum height | 260nm | 271nm |
| Average height | 161nm | 177nm |
| Width | 10.1um | 8.80um |

PHOTOVOLTAIC MODULE WITH OPTIMIZED ASPECT RATIO OF METAL GRID BASED ON SURFACE MODIFICATION

CROSS-REFERENCE TO RELATED APPLICATIONS

This application is a divisional application of U.S. patent application Ser. No. 18/933,503, filed on Oct. 31, 2024, which is a continuation of International Patent Application No. PCT/CN2023/134046, filed on Nov. 24, 2023. The content of the aforementioned application, including any intervening amendments thereto, is incorporated herein by reference in its entirety.

TECHNICAL FIELD

The present invention relates to the technical field of the optimization of the aspect ratio of a metal grid, and in particular, to a photovoltaic module with an optimized aspect ratio of a metal grid based on surface modification.

BACKGROUND

A thin-film photovoltaic module generally consists of a back electrode, an absorber, a buffer layer /i layer, and a front electrode. In order to avoid high series resistance and subsequent high current loss, the module is usually designed as a series of monolithic interconnected cells, and the specific structure is shown in FIG. 1.

Generally, the sequence of such a cell is shown in FIG. 2 (top view of FIG. 1) in which the front electrode and the back electrode are insulated by P1 and P3 and the front electrode and the back electrode are in electrical contact in P2 for the series connection of two adjacent cells. Since the structural area of P1, P2 and P3 does not generate electricity, it is also referred to as the "dead area" of the solar cell. The remaining cell area is referred to as the active cell area.

FIG. 3 shows the monolithic connection of three individual cells, without contact between the first cell and the third cell.

In order to optimize the power conversion efficiency of solar cells, a commonly considered method is to increase the transmission of the front electrode, for example, by reducing its layer thickness and increasing the generated photocurrent. However, this leads to an increase in the sheet resistance of the front electrode and therefore an increase in conduction loss. In order to reduce this conduction loss in the front electrode layer, highly conductive narrow metal grid lines can be applied on the front electrode layer to improve the related electrical conductivity, which is referred to as a metallization process for photovoltaic production.

As shown in FIG. 4, the application of a metal grid on the front electrode leads to the collection of charge carriers from the front electrode material due to the lower series resistance of the grid line material, so the concentrated current flows to the end of a cell. In the case of a monolithic interconnected cell, the current flow collected by the metal grid line towards the end of the cell is directly connected to the back electrode of the next cell through the P2 patterning line. Although the aforementioned metal grid structure reduces the conduction loss of the thinned front electrode to counteract the increase of series resistance, it also leads to an increase in the dead area due to the shading caused by the opaque grid lines on top of the active cell area.

The area of shading of the underlying absorber material is defined by the width and length of the metal lines. Although the length of the metal line should not be changed to benefit from the carrier collection in the metal line and the thinner front electrode (i.e. increasing the photocurrent without increasing the series resistance), the width and thickness of the metal lines can be optimized to reduce the area of shading, so as to increase the photocurrent and efficiency of the solar cell. The relationship between the width and thickness of the metal line is called the aspect ratio.

The series resistance of the metal lines is determined by the specific series resistance of the material it consists of and the cross-sectional area. Therefore, in order to improve the efficiency of the solar cell, shading should be reduced by reducing the width of the metal lines, while the thickness of the metal lines should be increased to prevent conduction loss.

In the prior art, commercial thin-film/CIGS photovoltaic manufacturers and related research institutions thereof have introduced their method for depositing a metal grid structure on a front electrode of a CIGS module, referred to as ALD (i.e. aluminum line deposition), which is a method for depositing an aluminum line structure through a mask by thermal evaporation. The resulting structure is shown in FIG. 5, where various disadvantages are:

1) low throughput and yield due to the use of a mask;
2) the high cost of this special mask for the production of large-area modules;
3) high material waste due to evaporation;
4) the high workload of mask maintenance, which is the most important for the efficiency of solar cells;
5) the limitation in the width (and aspect ratio) of the metal grid lines (the too narrow mask opening which is less than a few hundred micrometers can be easily blocked during or after use).

Another metallization process is screen printing to deposit metal grid lines. However, the screen printing method is not suitable for large-area printing due to its key technical limitations. That is, a large printed pattern will lead to low deposition accuracy and poor line shape (i.e. broad lines) especially in the middle region of the large-size printed area (e.g. >1 $m^2$) due to the low stiffness of a large-area central screen (i.e. bending effect). In addition, a high-quality screen (e.g. a hardened and calendered stainless steel screen or a knotless screen) is needed when screen printing is adopted to print narrow lines. For a full-size thin-film solar cell modules (e.g. >1 $m^2$), those high-quality large-size screens are very difficult to manufacture (less than two suppliers in the world are able to do it) and very expensive. In addition, the screens used in the process of grid printing can be easily blocked and are difficult to clean. Generally, a screen for si-pv6 "x6" will be scrapped if it is not cleaned after certain printing quantity. In addition to the high cost of screen printing for large thin-film modules, it is also quite inflexible to change the printed pattern of grid lines when the line pitch needs to be adjusted in the production of samples.

In addition to the conventional screen printing method, the prior art also shows the alternative rotary screen printing for conductive metal grid line deposition. However, the application of this technique is only applicable to si-pv6 "x6" wafers at present. For application to large-area thin-film modules, the problem is similar to that of conventional screen printing. For a large printing width, such as 600 mm to 1300 mm, that is, the chosen rotating tube material is difficult to maintain sufficient stiffness, which severely affects deposition accuracy and related grid line width.

The electron beam evaporation process is only suitable for the making of metal grid lines on a laboratory scale rather than on a large scale, so a full-area coating process is needed.

This method has similar problems and limitations as evaporation method when adopted, mainly low throughput and high cost.

Other process methods, such as aerosol jet printing or dispensing, are new techniques for the metallization process, which have a severe problem in process stability. Nozzles used for aerosol jetting and a dispenser can be easily blocked by metal particles in the long-term printing process, leading to frequent process downtime. In addition, these two methods are still at the early stage of development, and only 5 to 10 grid lines can be printed at most. For printing on a large-area thin-film module, printing needs to be performed multiple times, that is, the throughput of aerosol jet printing is very low at present, and it is very difficult to further increase the number of nozzles for dispensing or aerosol jetting. Therefore, the paste/aerosol distribution along the horizontal direction in a printing head is extremely challenging. At present, the ten-nozzle technique is a bottleneck of these two techniques.

The inkjet printing technique is a metallization method suitable for photovoltaic modules such as thin-film PV, organic PV or silicon solar cells. The adoption of inkjet printing allows various line shapes and forms, because it is a digital printing technique, which also makes it suitable for large-scale applications, especially in thin-film PV. One of the main disadvantages of this technique is that the composition of ink contains a small amount of metal particles and a large amount of solvent. This usually leads to broad and thin lines on the top of the front electrode of the solar cell. In addition, due to the coffee ring effect as shown in FIG. 6*a*) and FIG. 6*b*), the edges of the jetted ink line are thicker than the middle of the line.

All the existing methods for making metal grid lines on the top of a front electrode of a solar cell have a common solvent-based ink or paste. They are specific to the applied process and differ according to the ratio of metal to solvent. The width of metal grid lines largely depends on the surface energy and the wettability of ink. This obviously limits the use of materials as front electrodes and/or surface formation and/or surface treatment to obtain an optimized aspect ratio. In addition, an applied line shape may change after deposition, because metal grid lines must be heated/cured to remove the solvent and improve the electrical conductivity. Just reducing the ratio of solvent to metal, i.e. reformulation, may reduce the width of lines, but it will always lead to the blockage of the print head or the screen respectively. Another possible method for reducing the line width by using less material or smaller droplets will simultaneously lead to the thinning of the lines, thus increasing series resistance. In order to overcome this problem, a multi-application solution can usually keep a small line width and increase the thickness of the metal grid lines. However, especially for high-speed and large-scale production with high throughput, this method has the obvious disadvantage that metal lines produced will be scattered, that is, the produced metal grid lines will be misaligned.

Therefore, a method for optimizing the aspect ratio of a metal grid based on surface modification is provided to solve the aforementioned problems.

SUMMARY

In view of the problems existing in the prior art, the present invention provides a method for optimizing the aspect ratio of a metal grid based on surface modification. The objective of the method is to apply metal grid lines with a minimum width and sufficient thickness to reduce the shading of the metal lines and ensure low series resistance. The objective of the present invention is to optimize the aspect ratio by modifying the surface of a front electrode.

In order to achieve the aforementioned objectives, the method for optimizing the aspect ratio of a metal grid based on surface modification adopted by the present invention comprises:

obtaining a photovoltaic module comprising a front electrode;

providing laser process on the front electrode; and forming protrusion structures on the top of the front electrode by laser induction, at least two rows of protrusion structure groups forming a confining space, so that the width of liquid applied is confined within the spacing between the two adjacent protrusion structure groups and the thickness of the liquid applied is confined within the height of the formed protruding as well as the surface tension of the liquid.

Specifically, according to the method of the present invention, upwardly shaped protrusion structures, which can be irregular structures, are formed by induction on the top of the front electrode composed of a material of the front electrode, so that the applied ink and/or paste is confined between two or more lines.

Specifically, the formed protrusion structures usually have an irregular shape with a height ranging from several hundred nanometers to microns, and mainly depending on the thickness of a buffer layer and the front electrode, some protrusions may have small cracks, indicating that the evaporated material has been expelled. Their width is within a range of several hundred nanometers.

Specifically, the width of the formed protrusions is within a range of 10 μm, resulting in a minimum distance of about 10 μm between two lines.

Furthermore, the aforementioned method for optimizing the aspect ratio of a metal grid based on surface modification is applicable to a single-pass technique as well as many application methods like inkjet printing, including aerosol jetting, screen printing, dispensing, etc.

In particular, the present invention helps to prevent line widening as a result of small deviation in high-speed alignment of ink application in mass production.

The special implementation of the aforementioned method for optimizing the aspect ratio of a metal grid based on surface modification is discussed as follows:

1. Symmetrical or asymmetrical protrusion arrays are formed:
1) The form of two or more rows is adopted;
2) in this formed metal line, the minimum distance between each protrusion structure is limited to a certain range or less, and specifically, the range is small enough for capillary force to confine the applied liquid;
3) the change of the two adjacent rows of protrusion groups is small, that is, the applied liquid is confined in the gap formed by the two adjacent rows of protrusion arrays.

2. The applied liquid is confined between the two or more lines:
1) In particular, the gap between the two adjacent rows of protrusion groups is smaller than the width of the metal line on the untreated surface;
2) in particular, the minimum distance between the two adjacent rows of protrusion groups is 10 μm;
3) the gap between two adjacent protrusion structures in the same row is small, so that the capillary force confines the applied liquid.

3. The height of the protrusion structures is sufficient to confine the applied liquid:
1) Tension depends on the applied liquid;
2) due to the limitation of surface tension and other aspects, the height of the protrusion structures can be smaller than the final thickness of the metal grid lines.

The method for producing the aforementioned protrusion structures is discussed as follows:

1. Pulsed laser processing is adopted.
2. The wavelength of laser is at least larger than the optical band gap of an upper layer material. It should be noted that the upper layer material does not absorb the laser. Generally, the upper layer material refers to the front electrode and/or buffer layer /i layer and/or the absorber.

Further, the wavelength of the laser is smaller than the optical band gap of the material of one of the subsequent layers, so as to melt/evaporate the material on the inner surface to protrude the material to the top. It should be noted that the subsequent layer to the material absorbs the laser, and generally, the subsequent layer is at the interface between the absorber and the buffer layer.

3. A laser power is chosen within a range forming the protrusion structures. It should be noted that too high laser power will cause ablation, while too low laser power will cause the failure of protrusion formation.
4. Generally, all kinds of thin-film techniques are composed of at least two layers, and it is desirable to apply a line with a small width on the top of one layer.
5. Photovoltaic modules, such as CIGS, CdTe and perovskite, can be chosen.
6. A substrate is equipped with a thin-film PV module and a covering layer.
7. Metal grid processes for applying liquid, solvent or water based metal lines include inkjet, aerosol jetting, screen printing, dispensing, etc.
8. The material of the applied liquid is generally liquid, or can be metallic ink and dielectric ink.
9. The liquid can be applied once and/or multiple times.
10. The method for optimizing the aspect ratio of a metal grid based on surface modification according to the present invention is applicable to the design of metal grid lines of a front electrode and/or a back electrode (substrate or superstrate configuration).

In order to achieve the aforementioned objectives, a photovoltaic module with the aspect ratio of a metal grid based on surface modification adopted by the present invention comprises:

a front electrode;

protrusion groups, formed on the front electrode, each protrusion group comprising at least two protrusion structures, at least two rows of protrusion groups forming a protrusion arrangement, a gap for limiting the width of applied liquid being formed between two adjacent protrusion groups, and a height difference enabling a higher thickness of the applied liquid being formed between the top ends of the protrusion structures and the upper surface of the front electrode, wherein:

the protrusion structures are formed on the front electrode by laser induction.

Specifically, the front electrode comprises a liquid application area and a liquid leakage prohibition area, wherein the liquid application area comprises liquid, a front electrode, a buffer layer, an absorber and a back electrode or liquid, a front electrode and a back electrode in sequence along the thickness direction, and the liquid leakage prohibition area comprises a back electrode along the thickness direction.

Specifically, the wavelength of the laser is larger than the optical band gap of a front electrode material and smaller than the optical band gap of a material at the interface between the buffer layer and the absorber.

Specifically, the aforementioned protrusion arrangement includes juxtapositional arrangement, staggered arrangement, and disordered arrangement. The spacing between two adjacent protrusion groups is greater than 10 μm, and the spacing between two adjacent protrusion structures in the same row can be 50 nm.

Specifically, the laser is a pulsed laser.

The method for optimizing the aspect ratio of a metal grid based on surface modification according to the present invention has the following beneficial effects:

According to the method for optimizing the aspect ratio of a metal grid based on surface modification proposed by the present invention, the objective of the method is to apply metal grid lines with a minimum width and sufficient thickness to reduce the shading of the metal lines and ensure low series resistance. The objective of the present invention is to optimize the aspect ratio by modifying the surface of a front electrode.

The present invention provides the photovoltaic module with the aspect ratio of a metal grid based on surface modification to modify the surface of a front electrode of a thin-film solar cell in particular, so as to improve the aspect ratio of metal grid lines.

With reference to the following description and accompanying drawings, specific embodiments of the present invention will be disclosed Specifically, indicating the way by the principle of the present invention can be adopted. It should be understood that the scope of the embodiments of the present invention is not limited by this, and the embodiments of the present invention include many changes, modifications, and equivalents.

DETAILED DESCRIPTION OF EMBODIMENTS

In order to make the objective, technical solution and advantages of the present invention clearer, the present invention is further described Specifically below in reference to accompanying drawings and embodiments. It should be understood that the specific embodiments described herein are only intended to explain the present invention rather than to limit the scope of the present invention.

It should be noted that if an element is said to be "arranged on or provided with" another element, it may be directly on the another element or there may be an intermediate element; if an element is considered to be "connected to or with" another element, it may be directly connected to the another element or there may also be an intermediate element; "fixed connection" means fixed connection, and there are many fixed connection methods, which are not regarded as being in the protection scope of this article; and the terms "vertical", "horizontal", "left" and "right" and similar expressions used in this article are only for the purpose of illustration, and do not represent the only embodiment.

Unless otherwise defined, all the technical and scientific terms used herein have the same meanings as commonly understood by those skilled in the art of the present invention. The terms used in the present specification herein are only for the purpose of describing specific embodiments, and are not intended to limit the present invention. The term "and/or" used herein includes any and all combinations of one or more related listed items.

Figure 1:
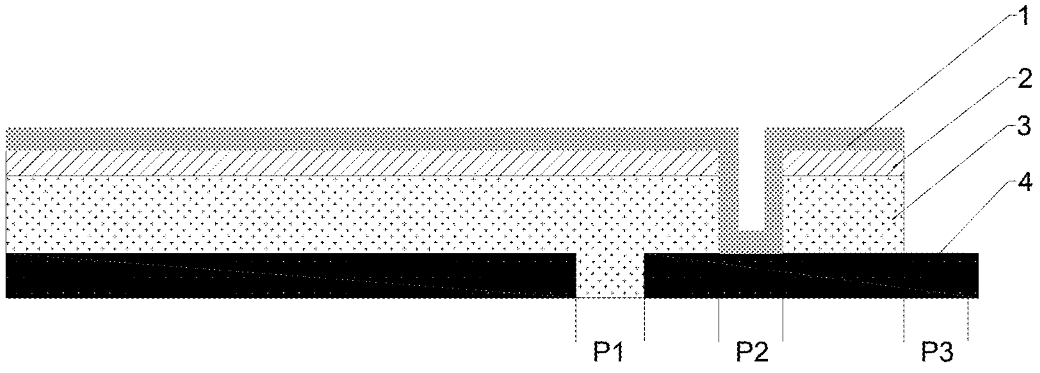
FIG. 1 is a schematic diagram of a layer stack of a thin-film solar cell commonly used in the background art.
Figure 2:
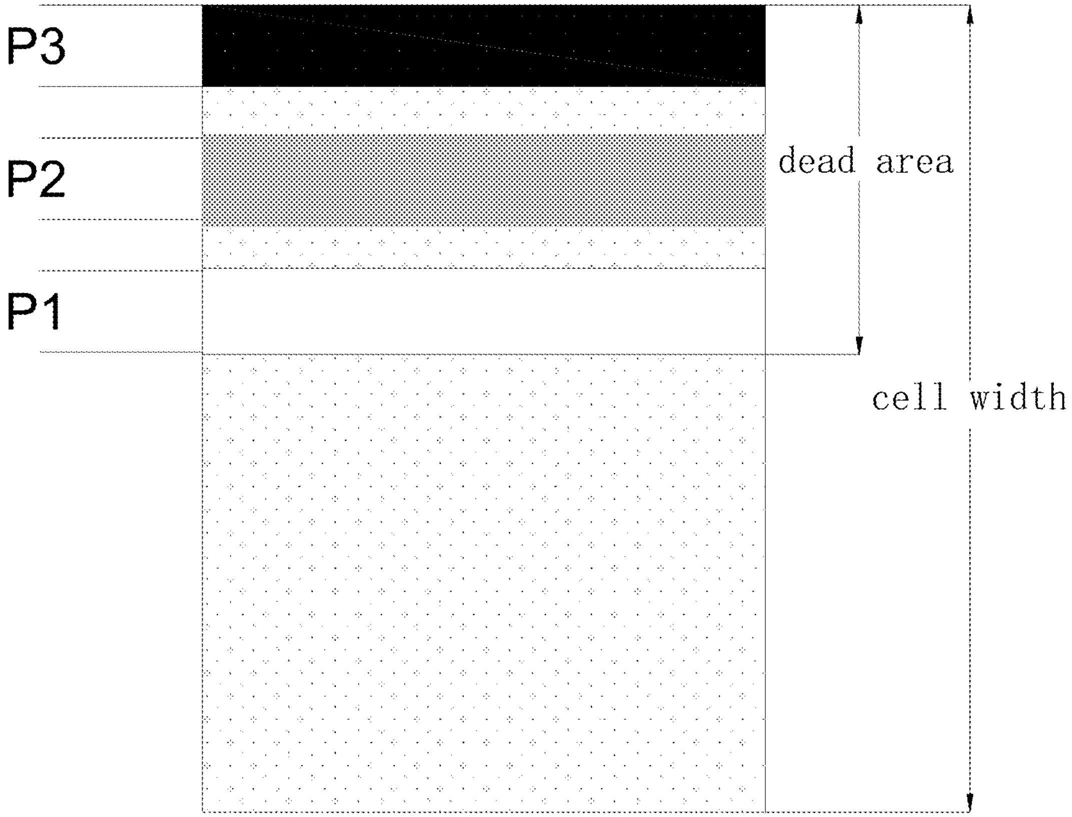
FIG. 2 is a schematic structural diagram of the cell width and dead area of a standard thin-film solar cell in the background art and a top view of FIG. 1.
Figure 3:
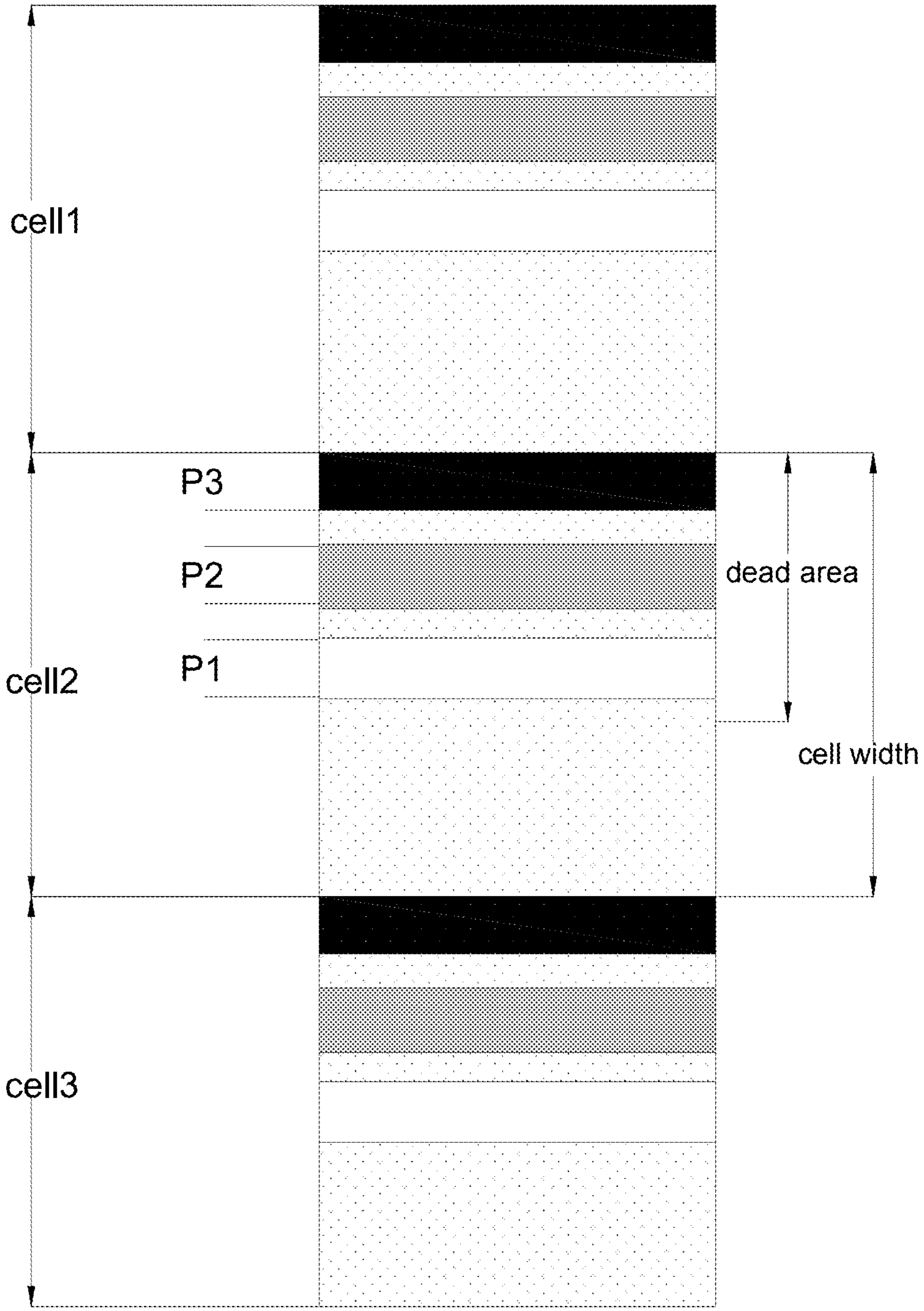
FIG. 3 is a schematic structural top view of the interconnection between three cells of a standard thin-film PV module in the background art.
Figure 4:
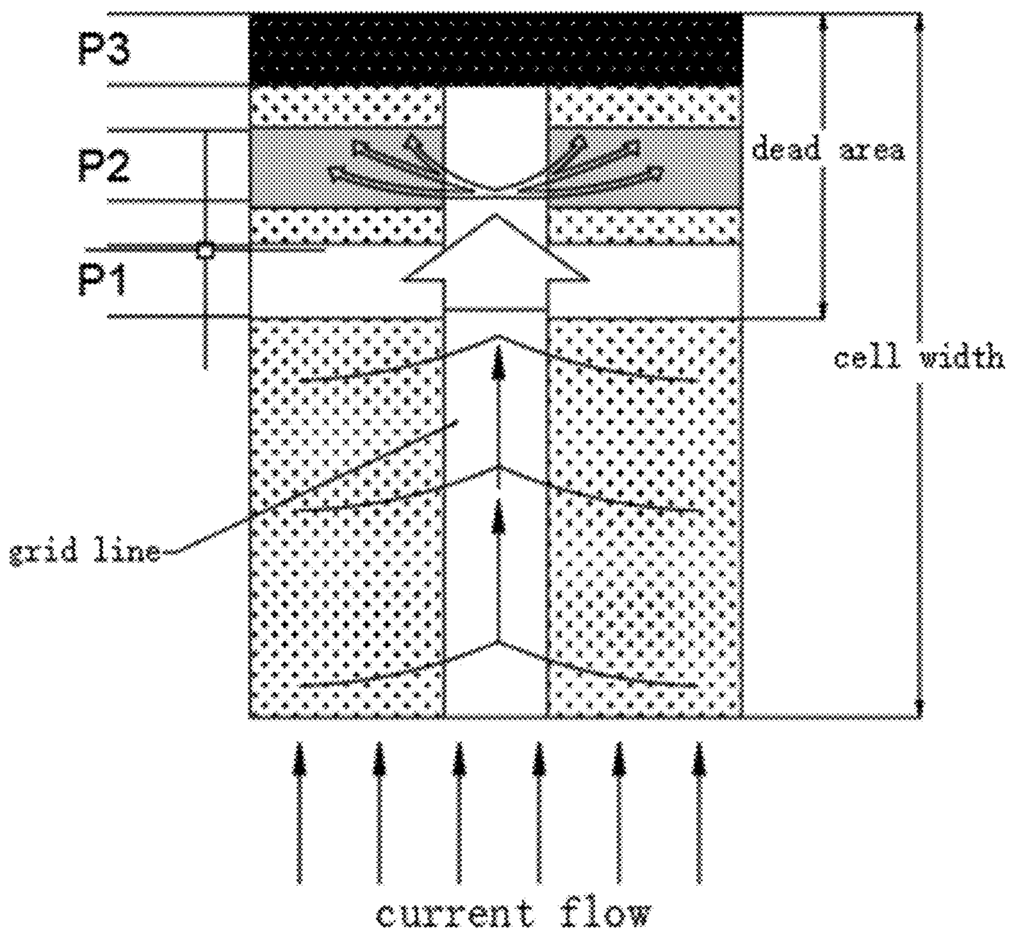
FIG. 4 is a schematic diagram of current at a metal grid in a cell in the background art.
Figure 5:
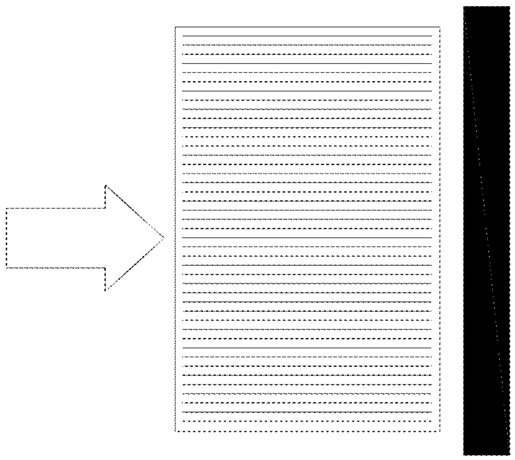
FIG. 5 is a schematic diagram of the ALD (aluminum line deposition) process used in the background art.
Figure 6A:
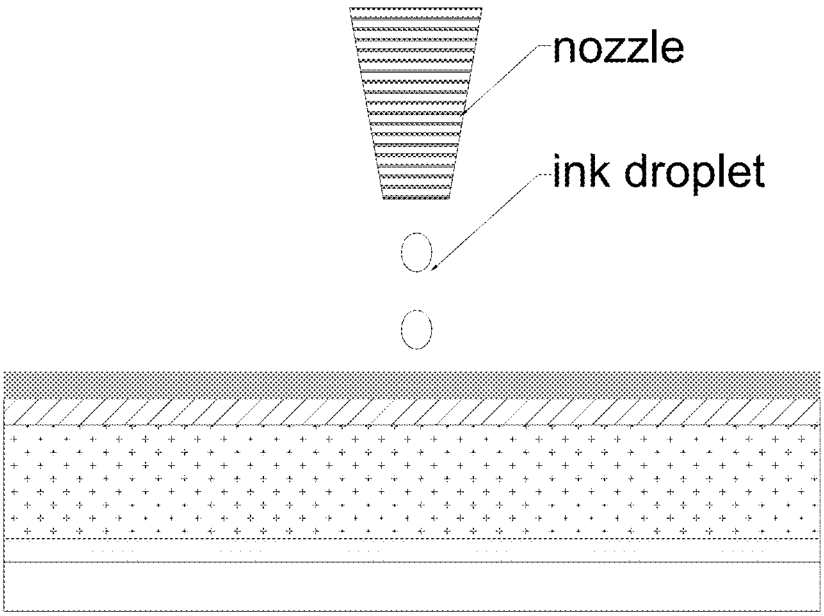
FIG. 6*a*) is a schematic diagram of an inkjet application of a front electrode of a solar cell in the background art.
Figure 6B:
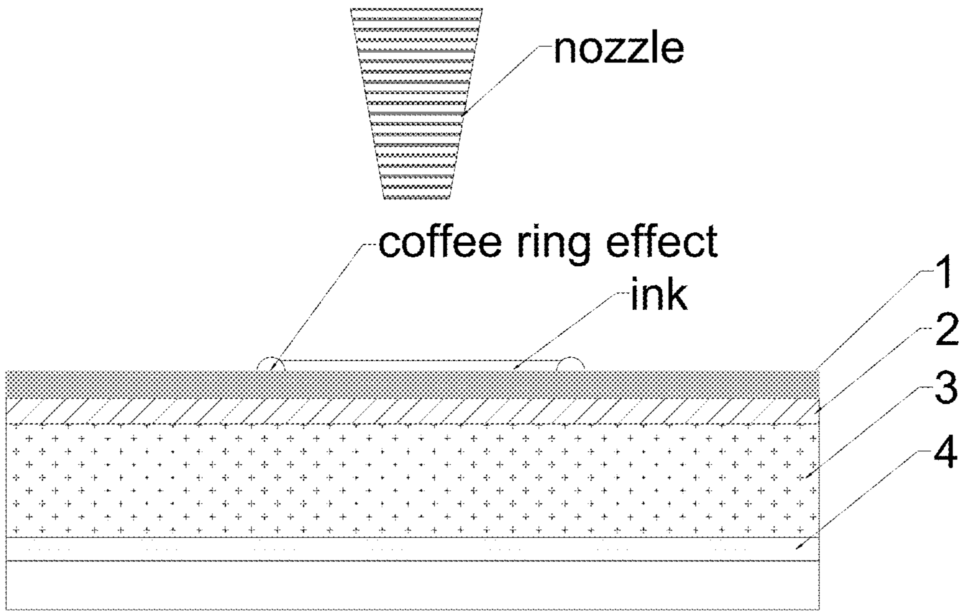
FIG. 6*b*) is a schematic diagram of the distribution of an liquid film (i.e. ink) on the top of a front electrode in the background art.

In order to reduce the widening of metal lines shown in FIG. 6*a*) and FIG. 6*b*), a method is proposed to form one part of a front electrode, i.e. a method for optimizing the aspect ratio of a metal grid based on surface modification. The method according to the present invention is used to form upward regular or irregular protrusion structures on the top of the front electrode composed of a material of the front electrode by induction in such a way that ink and/or paste applied are confined between two or more lines.

Figure 7A:
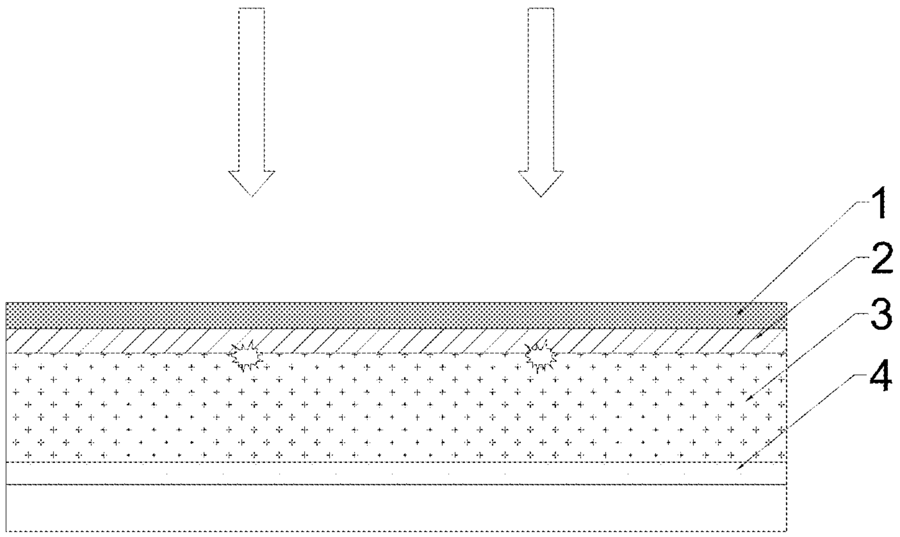
FIG. 7*a*) shows that the application of pulsed laser under the band gap of a front electrode and a buffer layer at two points on the surface of a solar cell in the present invention causes the materials of the front electrode and the buffer layer on the top of the surface of the solar cell in FIG. 7*b*) to protrude.
Figure 7B:
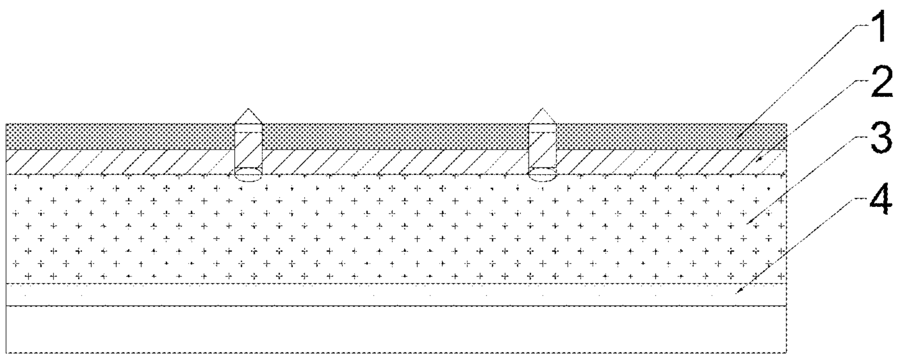

The specific embodiments of the method for optimizing the aspect ratio of a metal grid based on surface modification according to the present invention will be illustrated with reference to the accompanying drawings. FIG. 7*a*) and FIG. 7*b*) shows the way forming the protrusion structures. Specifically, FIG. 7*a*) shows that the application of a pulsed laser emitting at an energy under the band gap of the front electrode and a buffer layer at two points on the surface of a solar cell causes the materials of the front electrode and the buffer layer on the top of the surface of the solar cell in FIG. 7*b*) to protrude. Specifically, a method for applying about 15 ps pulsed laser with a wavelength of 1064 nm to a thin-film CIGS solar cell was tested. The laser is not absorbed by TCO and the buffer layer, because the energy of the laser is obviously lower than the band gap of the corresponding materials. Therefore, the laser passes through the upper layers and is absorbed at the interface between the absorber layer and the buffer layer, because the band gap of the absorber layer is lower than the laser energy. The absorption of a single laser pulse will lead to the melting and evaporation of part of the materials of the absorber layer and the buffer layer in the stack, and the power of the laser beam must be chosen in a way that small protrusions can be formed on the surface of the front electrode. Too low power will only lead to local heating without any confining effect due to no forming of protrusions. Too high power will lead to the complete ablation of the buffer layer and the front electrode layer, which will lead to the widening of the lines and the increase of the series resistance of the interconnection area and greatly reduce the thickness between the metal grid and the front electrode (ink/paste material will fill the produced holes). It should be noted that the maximum height of the protrusions is the combined thickness of the front electrode and buffer/i-layer. The laser power used to form the desired protrusions mainly depends on the thicknesses and material compositions of the buffer layer and the front electrode, specifically including hardness, stiffness, tension, adhesion, etc.

Figure 8A:
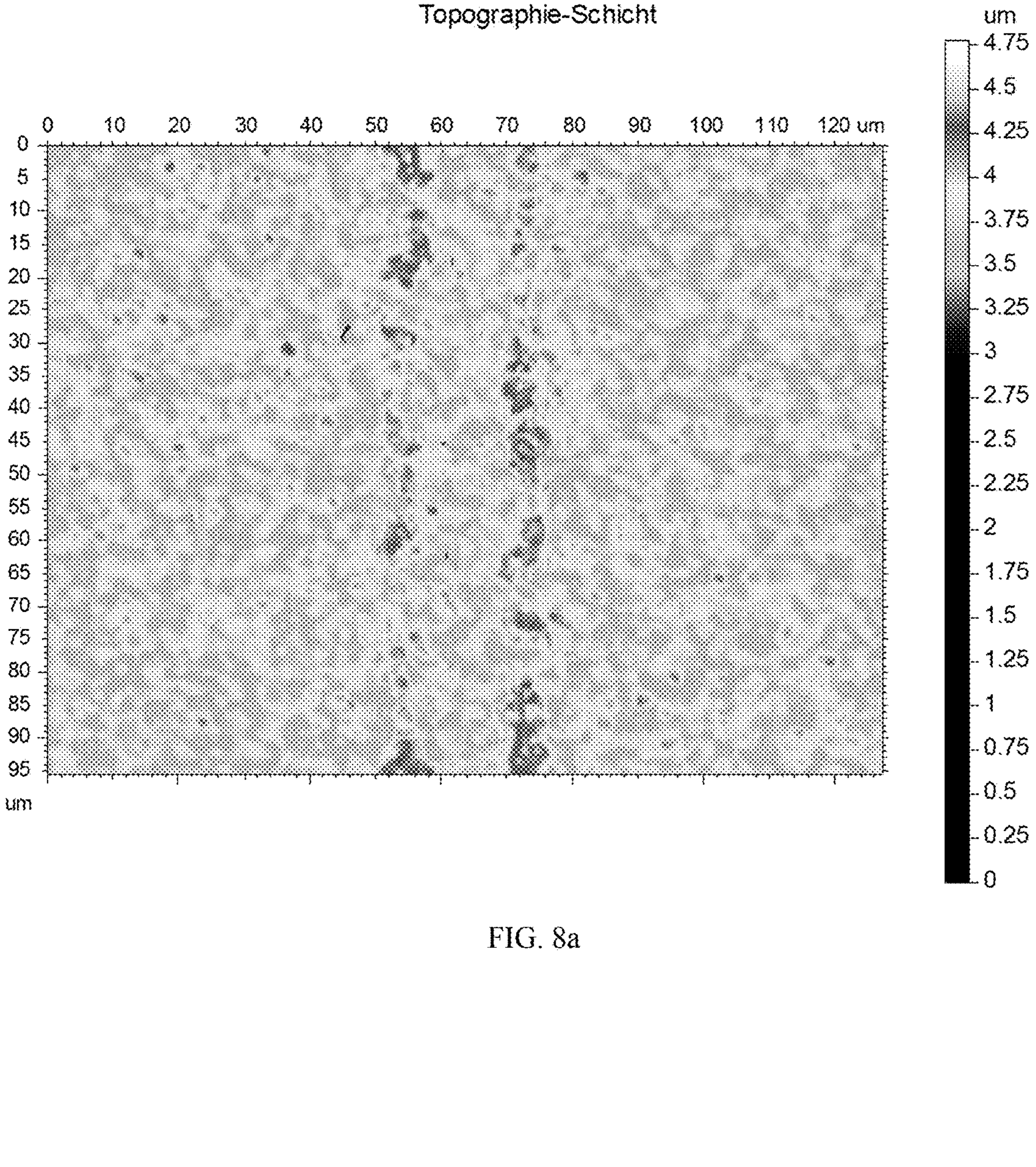
FIG. 8*a*) is a greyscale 2D image taken by a confocal microscope in the present invention showing formed protrusions on a front electrode.

FIGS. 8*a*), 8*b*) and 9 depict images of such a protrusion structures formed on the top of the front electrode of a thin-film solar cell.

Figure 8B:
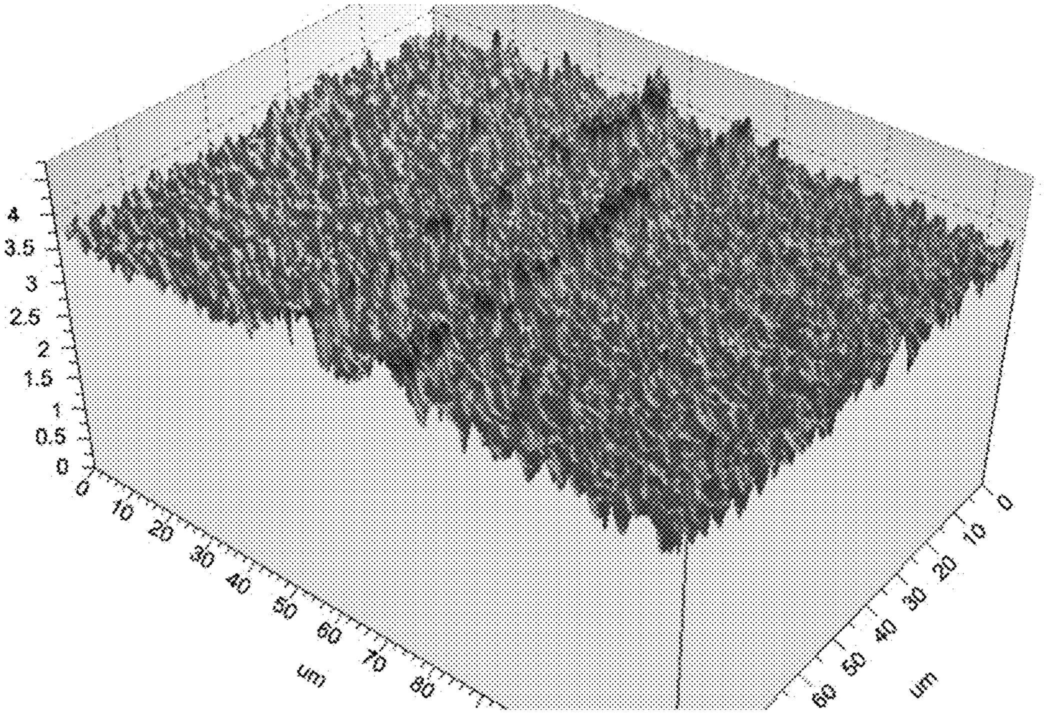
FIG. 8*b*) is a greyscake 3D image taken by a confocal microscope in the present invention, visualitation of FIG. 8*a*)

Specifically, FIG. 8*a*) and FIG. 8*b*) is a greyscale image taken by a confocal microscope, FIG. 8*a*) is a 2D image, and FIG. 8*b*) is a 3D image. The confining condition is that two protrusion groups are formed on the top of the front electrode, so as to confine the applied liquid, which may be ink or paste, and the structure shown is produced when the target distance is 20 μm.

Figure 9:
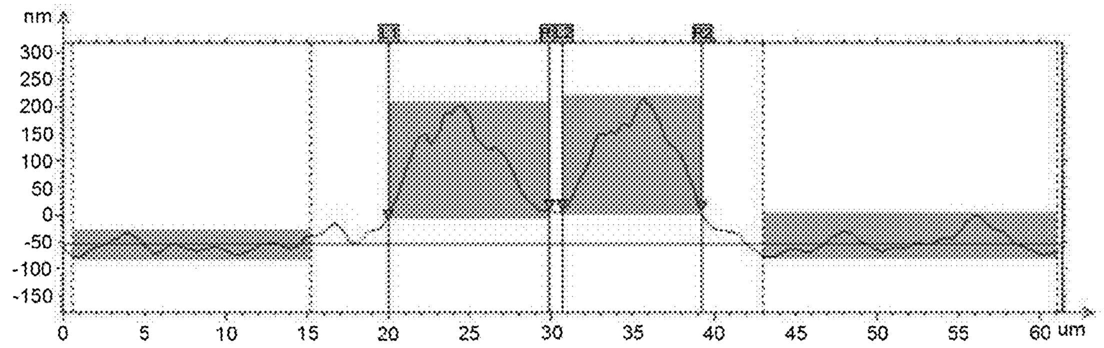
FIG. 9 is a cross-sectional image of two rows of protrusions formed on the top of the front electrode according to the present invention.

FIG. 9 is a cross-sectional image of two rows of protrusion groups formed on the top of the front electrode. The structure shown is produced when the target distance is 10 μm. The average height of the achieved protrusions is about 170 nm, and the maximum height is greater than 170 nm. The width of the produced protrusion structure is within a range of about 10 μm.

Further, the formed protrusion structure usually has an irregular shape with a height ranging from a few hundreds nanometers to microns, specifically depending on the thickness of the buffer layer and the front electrode. Small cracks may appear in some protrusion structures, indicating that the evaporated material has been partly expelled, and the width of the aforementioned protrusion structure is within a range of a few hundred nanometers.

Further, the form of the aforementioned protrusion structure is adjusted according to the liquid used and the desired width and thickness of the obtained metal grid lines. The liquid includes ink or paste. In some tests, the width of the protrusion structure was within a range of 10 μm, resulting in a minimum distance of about 10 μm between two adjacent rows of protrusion groups as shown in FIG. 9. A single protrusion structure without a confining space for the filling of the liquid will be formed if the aforementioned distance is less.

Figure 10A:
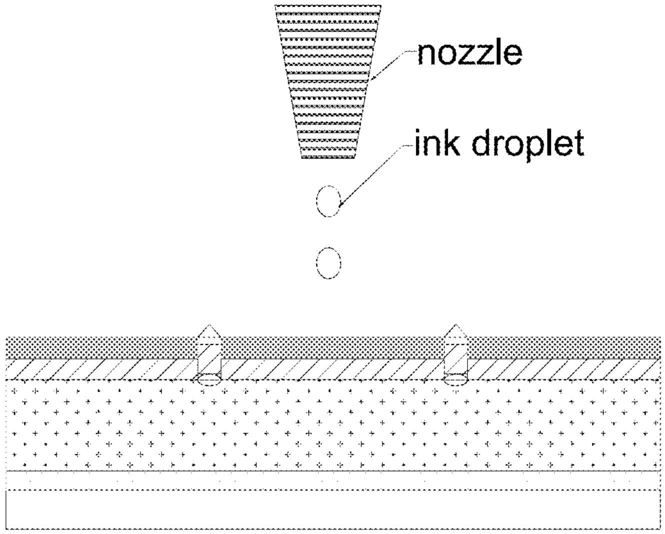
FIG. 10*a*) shows the application of ink between protrusions formed on the surface of the thin-film solar cell.
Figure 10B:
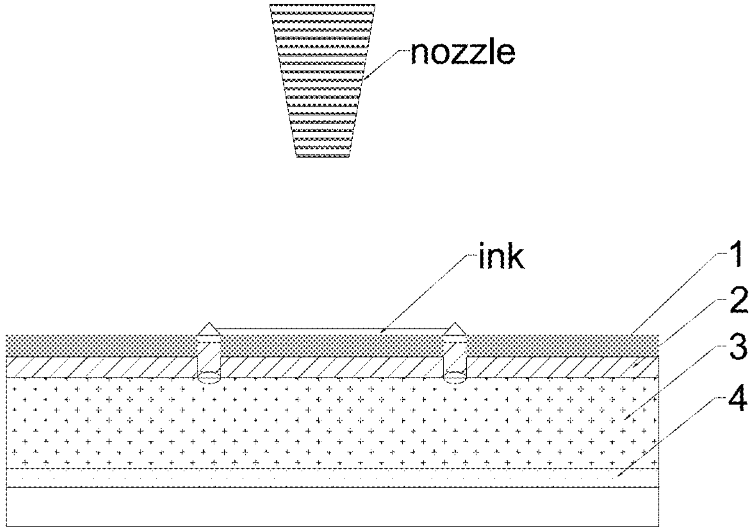
FIG. 10*b*) shows the confinement and uniform distribution of ink by the formed protrusions.

FIG. 10*a*) and FIG. 10*b*) shows that a confining space formed by two or more rows of protrusion groups within a certain distance can confine and be filled with liquid. Specifically, FIG. 10*a*) shows that the liquid is applied between the protrusions formed on the surface of the thin-film solar cell, and FIG. 10*b*) shows a protrusion structure that confines and uniformly distributes ink.

Figure 11A:
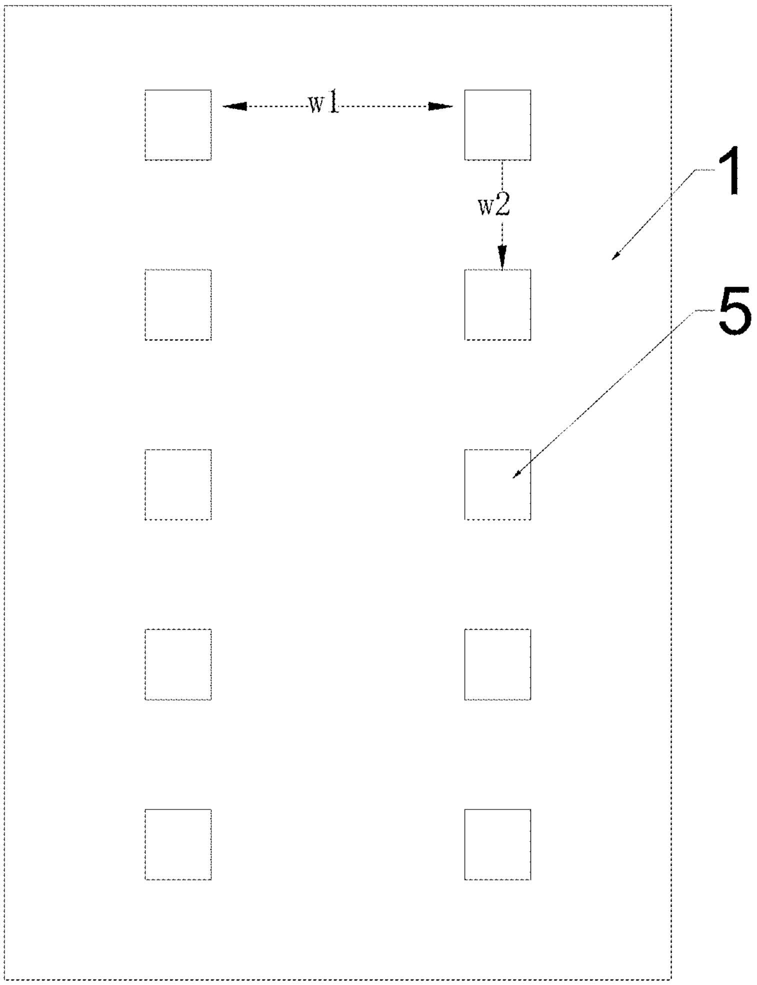
FIG. 11*a*) shows protrusion arrays formed in a symmetrical manner.
Figure 11B:
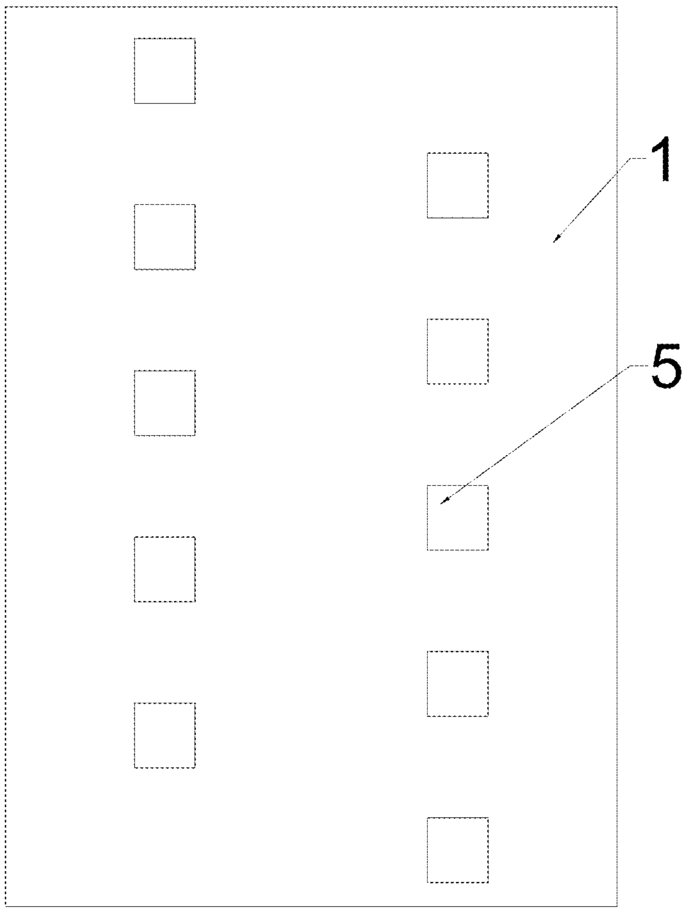
FIG. 11*b*) shows protrusion arrays formed in a staggered manner.
Figure 11C:
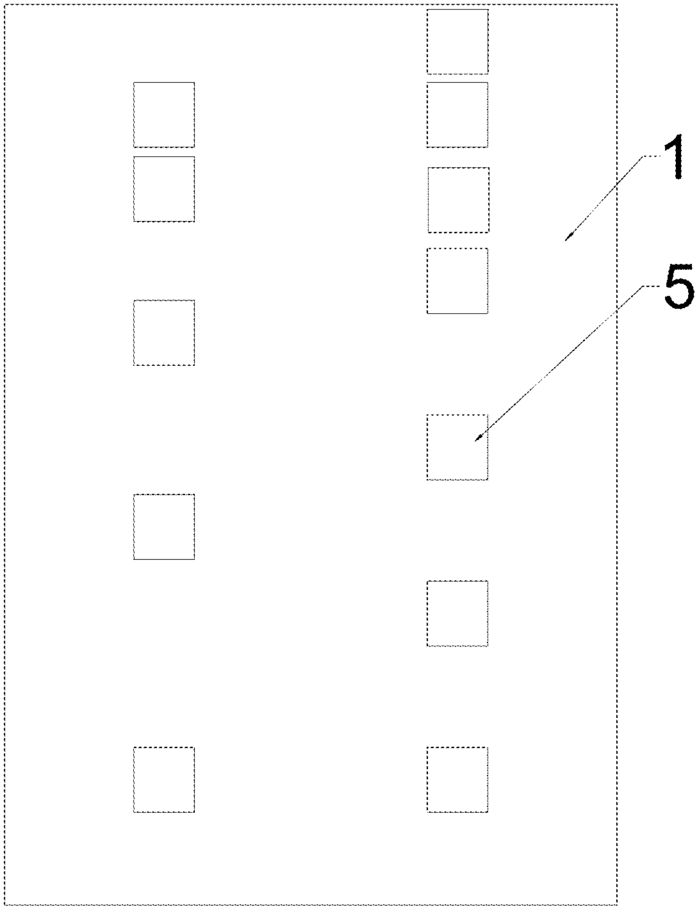
FIG. 11*c*) protrusion arrays formed in a disordered manner.

FIG. 11*a*), FIG. 11*b*) and FIG. 11*c*) shows a possible embodiment of using pulsed laser to form protrusion structures. Specifically, in FIG. 11*a*), FIG. 11*b*) and FIG. 11*c*), the distance between two rows of protrusion groups is defined as w1, which also identifies the width of metal grid lines. The distance w2 is the spacing between two adjacent protrusion structures in the same row, which must be set small enough to ensure capillary force to confine the liquid between two lines, i.e., no leakage between two adjacent protrusion structures in the same row.

Specifically, FIG. 11*a*) shows a symmetrical protrusion array, FIG. 11*b*) shows a staggered protrusion array, and FIG. 11*c*) shows a disordered protrusion array.

It should be noted that the aforementioned protrusion arrays may also be identified as protrusion arrangements.

Further, in the examples shown in FIG. 8 a), FIG. 8*b*) and FIG. 9, the distance w1 of tens of microns, the distance w2 within a range of a few microns and the height of a few hundred nanometers are particularly suitable for the application for the inkjet technique, mainly because the distance w2 is small enough to enable the capillary force to really confine the ink between the two produced lines and the height is enough to prevent the material from overflowing out of the protrusion structure.

Of course, the method for optimizing the aspect ratio of a metal grid based on surface modification can be used to not only with the single-pass technique but also a variety of techniques, particularly the inkjet technique. In particular, the present invention helps to prevent line widening caused by small deviation in the high-speed alignment of ink application during mass production.

FIGS. * to 14 show a metal grid representation. Specifically, FIG. 12 shows a cross-sectional view of the stack of a thin-film solar cell with a metal grid line structure, FIG. 13 shows a schematic top view of the grid width and grid pitch of the thin-film solar cell with a metal grid, and FIG. 14 shows a top view of the interconnection between three cells of a thin-film PV module with a metal grid.

Figure 12:
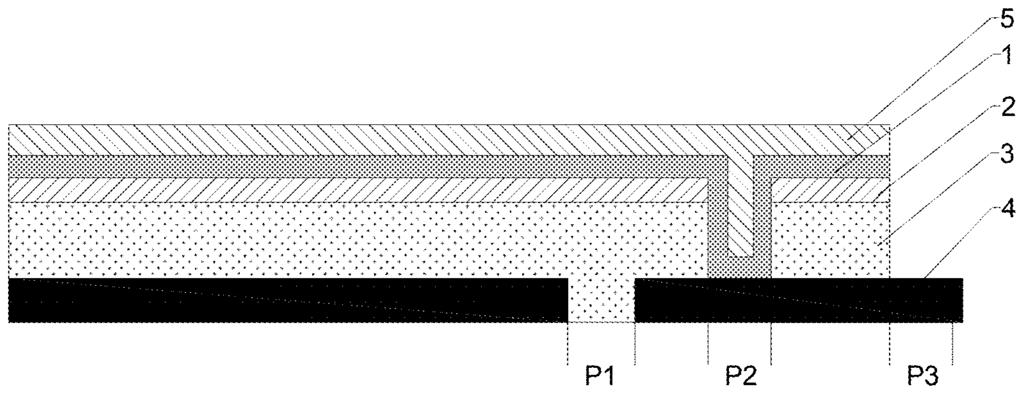
FIG. 12 is a schematic cross-sectional bottom view of a thin-film solar cell stack with a metal grid in the present invention.
Figure 13:
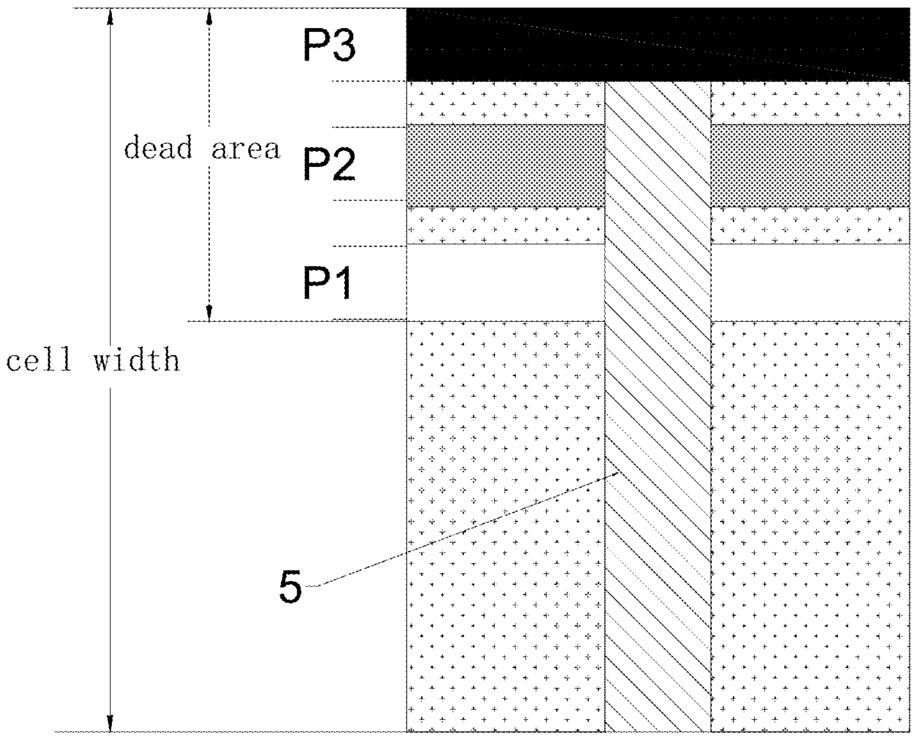
FIG. 13 is a schematic top view of the grid width and grid pitch of the thin-film solar cell with the metal grid in the present invention.
Figure 14:
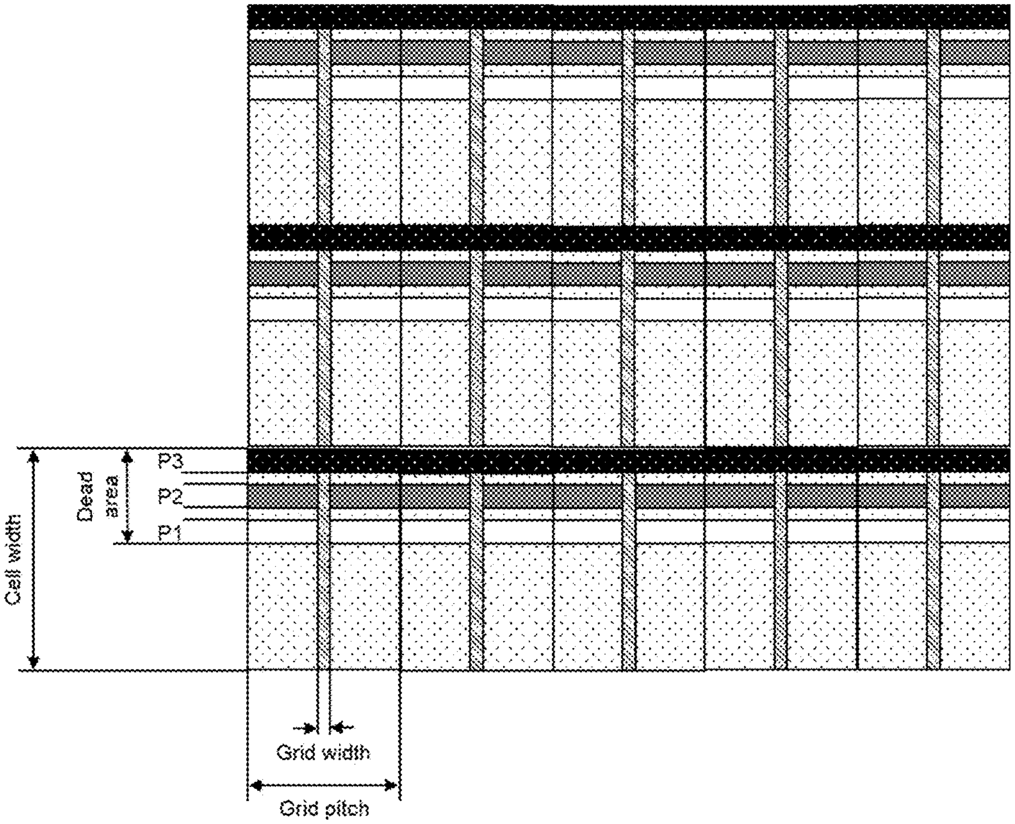
FIG. 14 is a schematic top view of the interconnection between three cells of a thin-film PV module with a metal grid in the present invention.

Specifically, in FIGS. 12 to 14, the metal grid line structure is applied transversely to the cells or perpendicular to P1, P2 and P3 at periodic intervals. These metal grid lines are continuously applied to the solar cell, and P3 interrupts the metal grid lines to prevent a short circuit between the front electrode of one cell and the front electrode of an adjacent cell.

To sum up, the special implementation of the aforementioned method for optimizing the aspect ratio of a metal grid based on surface modification is discussed as follows:

1. Symmetrical or asymmetrical protrusion arrays are formed:
   1) The form of two or more rows is adopted;
   2) in this formed metal lines, the minimum distance between each protrusion structure is limited to a certain range or less, and specifically, the range is small enough for capillary force to confine the applied liquid;
   3) the change of the two adjacent rows of protrusion groups is small, that is, the applied liquid is confined in the gap formed by the two adjacent rows of protrusion arrays.
2. The applied liquid is confined between the two or more lines:
   1) In particular, the gap between the two adjacent rows of protrusion groups is smaller than the width of the metal line on the untreated surface;
   2) in particular, the minimum distance between the two adjacent rows of protrusion groups is 10 μm;
   3) the gap between two adjacent protrusion structures in the same row is small, so that the capillary force confines the applied liquid. It should be noted that in the example of CIGS, it is a few microns.
3. The height of the protrusion structures is sufficient to confine the applied liquid:
   1) Tension depends on the applied liquid;
   2) due to the effect of surface tension and other aspects, the height of the protrusion structures can be smaller than the final thickness of the metal grid lines.

The method for producing the aforementioned protrusion structures is discussed as follows:

1. Pulsed laser process is adopted.
2. The wavelength of laser is at least larger than the optical band gap of an upper layer material. It should be noted that the upper layer material does not absorb the laser or only to a small extent (less than e.g. 20%). Generally, the upper layer material generally refers to the front electrode and/or buffer layer/i layer and/or the absorber.

Further, the wavelength of the laser is smaller than the optical band gap of the material of one of the subsequent layers, so as to melt/evaporate the material on the inner surface to protrude the material above. It should be noted that the subsequent layer to the material absorbs the laser, and generally, the subsequent layer is at the interface between the absorber and the buffer layer.

3. A laser power is chosen within a range forming the protrusion structures. It should be noted that too high laser power will cause ablation, while too low laser power will cause the failure of protrusion formation.
4. Generally, all kinds of thin-film techniques are composed of at least two layers, and it is desirable to apply a line with a small width on the top of one layer.
5. Photovoltaic modules, such as CIGS, CdTe and perovskite, can be chosen.
6. A substrate is equipped with a thin-film PV module and a covering layer.
7. Metal grid processes for applying liquid, solvent or water based metal lines include inkjet, aerosol jetting, screen printing, dispensing, etc.
8. The material of the applied liquid is generally liquid, or can be metallic ink and dielectric ink.
9. The liquid can be applied once and/or multiple times.
10. The method for optimizing the aspect ratio of a metal grid based on surface modification according to the present invention is applicable to the design of metal grid lines of a front electrode and/or a back electrode (substrate or superstrate configuration).

The following example is provided for the aforementioned method for forming protrusion structures:

CIGS with 750 nm of AZO thickness and 65 nm of ZnOS thickness is taken as an example:

The process window with a wavelength of 1064 nm, a laser pulse of 15 ps, a repetition rate of 500 kHz, a speed of 10800 mm/min and a beam diameter of about 20 μm (2w0) is between 150 mW to 250 mW laser power.

Further, a photovoltaic module with the aspect ratio of a metal grid based on surface modification adopted by the present invention comprises:

a front electrode;

protrusion groups, formed on the front electrode, each protrusion group comprising at least two protrusion structures, at least two rows of protrusion groups forming a protrusion arrangement, a gap for limiting the width of applied liquid being formed between two adjacent protrusion groups, and a height difference for enabling the higher thickness of the applied liquid being formed between the top ends of the protrusions and the upper surface of the front electrode, wherein:

the protrusions are formed on the front electrode by laser induction.

Specifically, the front electrode comprises a liquid application area and a liquid leakage prohibition area, wherein the liquid application area comprises liquid, a front electrode, a buffer layer, an absorber and a back electrode or liquid, a front electrode and a back electrode in sequence along the thickness direction, and the liquid leakage prohibition area comprises a back electrode along the thickness direction.

Specifically, the wavelength of the laser is larger than the optical band gap of a front electrode material and smaller than the optical band gap of a material at the interface between the buffer layer and the absorber.

Specifically, the aforementioned protrusion arrangement includes juxtapositional arrangement, staggered arrangement, and disordered arrangement. The spacing between two adjacent protrusion groups is greater than 10 μm, and the spacing between two adjacent protrusion structures in the same row can be 50 nm.

Specifically, the laser is a pulsed laser.

It should be noted that in the accompanying drawings, the front electrode is denoted by reference numeral 1, the buffer layer is denoted by reference numeral 2, the absorber is denoted by reference numeral 3, the back electrode is denoted by reference numeral 4, the protrusion is denoted by reference numeral 5, the liquid application are is denoted by reference numeral P1 or P2, and the liquid leakage prohibition area is denoted by reference numeral P3.

the P1 region comprises a liquid, a front electrode, a buffer layer and an absorber in sequence along the thickness direction;

the P2 region comprises a liquid, a front electrode and a back electrode in sequence along the thickness direction; and the P3 region comprises a back electrode in the thickness direction.

What is described above is merely the preferred embodiment of the present invention, and is not intended to limit the present invention, and any modifications, equivalent replacement, improvements and the like which are made within the spirit and principle of the present invention shall fall within the protection scope of the present invention.

What is claimed is:

1. A photovoltaic module with an optimized aspect ratio of a metal grid based on surface modification, comprising:

a front electrode; and a plurality of protrusion groups, formed on the front electrode, each of the plurality of protrusion groups comprising at least two protrusion structures, at least two of the plurality of protrusion groups forming a protrusion arrangement, a gap for limiting a width of applied liquid being formed between any adjacent two of the plurality of protrusion groups, and a height difference being formed between top ends of the protrusion structures and an upper surface of the front electrode;

the front electrode comprises a liquid application area and a liquid leakage prohibition area;

the liquid application area comprises a liquid, the front electrode, a buffer layer, an absorber and a back electrode, or the liquid, the front electrode and the back electrode in sequence along a thickness direction;

the liquid leakage prohibition area comprises the back electrode along a thickness direction;

the at least two protrusion structures are formed by induction using a laser on the front electrode; and a wavelength of the laser is larger than an optical band gap of a material of the front electrode and smaller than an optical band gap of a material at an interface between the buffer layer and the absorber; and the laser is absorbed at the interface between the buffer layer and the absorber, so that the protrusion structures protrude upward from the interface between the buffer layer and the absorber and pass through the front electrode.

2. The photovoltaic module of claim 1, wherein the protrusion arrangement comprises a juxtapositional arrangement, a staggered arrangement, and a disordered arrangement; a spacing between any adjacent two of the plurality of protrusion groups is greater than 10 μm; and the laser is a pulsed laser.

3. The photovoltaic module of claim 2, wherein the photovoltaic module comprises copper indium gallium selenide (CIGS), cadmium telluride (CdTe), and perovskite; and the liquid comprises metallic ink or dielectric ink.

* * * * *